United States Patent
Zeng et al.

(10) Patent No.: US 10,290,666 B2
(45) Date of Patent: May 14, 2019

(54) THIN FILM TRANSISTOR (TFT) ARRAY SUBSTRATES AND MANUFACTURING METHODS THEREOF

(71) Applicant: Shenzhen China Star Optoelectronics Technology Co., Ltd., Shenzhen, Guangdong (CN)

(72) Inventors: Mian Zeng, Guangdong (CN); Xiaodi Liu, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 13 days.

(21) Appl. No.: 15/541,343

(22) PCT Filed: May 27, 2017

(86) PCT No.: PCT/CN2017/086233
§ 371 (c)(1),
(2) Date: Jun. 30, 2017

(87) PCT Pub. No.: WO2018/205318
PCT Pub. Date: Nov. 15, 2018

(65) Prior Publication Data
US 2018/0331132 A1    Nov. 15, 2018

(51) Int. Cl.
*H01L 27/14* (2006.01)
*H01L 29/04* (2006.01)
(Continued)

(52) U.S. Cl.
CPC ........ *H01L 27/1288* (2013.01); *H01L 21/762* (2013.01); *H01L 29/0649* (2013.01);
(Continued)

(58) Field of Classification Search
None
See application file for complete search history.

(56) References Cited

U.S. PATENT DOCUMENTS

| 9,437,435 B2 | 9/2016 | Wang et al. |
| 9,640,559 B2 | 5/2017 | Liu et al. |

(Continued)

FOREIGN PATENT DOCUMENTS

| CN | 103268876 A | 8/2013 |
| CN | 103901691 A | 7/2014 |

(Continued)

*Primary Examiner* — Calvin Y Choi
(74) *Attorney, Agent, or Firm* — Andrew C. Cheng

(57) ABSTRACT

The present disclosure relates to a thin film transistor (TFT) array substrate and a manufacturing method thereof. The manufacturing method includes adopting a shading metal layer to form the bottom gate electrode, depositing a buffer layer on the substrate having the bottom gate electrode, applying a patterned process on the buffer layer to reduce the thickness of the buffer layer on the bottom gate electrode, applying the patterned process on the semiconductor layer to form the semiconductor pattern corresponding to the bottom gate electrode within the thin area of the buffer layer. The present disclosure may reduce a thickness of the buffer layer corresponding to the bottom gate electrode, so as to improve the whole performance of the array substrate caused by the bottom gate electrode.

19 Claims, 6 Drawing Sheets

(51) Int. Cl.
*H01L 29/15* (2006.01)
*H01L 31/036* (2006.01)
*H01L 27/12* (2006.01)
*H01L 29/786* (2006.01)
*H01L 21/762* (2006.01)
*H01L 29/423* (2006.01)
*H01L 29/06* (2006.01)

(52) U.S. Cl.
CPC ...... *H01L 29/42384* (2013.01); *H01L 29/786* (2013.01); *G02F 2201/123* (2013.01)

(56) References Cited

U.S. PATENT DOCUMENTS

| | | | |
|---|---|---|---|
| 2002/0160553 A1* | 10/2002 | Yamanaka | H01L 21/02524 438/149 |
| 2006/0006385 A1* | 1/2006 | Park | G02F 1/13458 257/59 |
| 2010/0117076 A1 | 5/2010 | Kengo et al. | |
| 2014/0203276 A1 | 7/2014 | Yamazaki et al. | |
| 2015/0069336 A1 | 3/2015 | Okumura et al. | |
| 2016/0035753 A1* | 2/2016 | Liu | H01L 27/1214 257/66 |
| 2018/0021206 A1 | 1/2018 | Andersen | |

FOREIGN PATENT DOCUMENTS

| | | |
|---|---|---|
| CN | 104465516 A | 3/2015 |
| CN | 104716091 A | 6/2015 |
| EP | 0175215 A1 | 3/1986 |

\* cited by examiner

THIN FILM TRANSISTOR (TFT) ARRAY SUBSTRATES AND MANUFACTURING METHODS THEREOF

BACKGROUND OF THE INVENTION

1. Field of the Invention

The present disclosure relates to display field, and more particularly to a thin film transistor (TFT) array substrate and a manufacturing method thereof.

2. Discussion of the Related Art

With respect to active array display devices, the dual gate TFT is adopted due to the attribute such as higher mobility, greater on state current, smaller subthreshold swing, stable and uniform threshold voltage (Vth), when being compared with single-gate TFTs. As such, the threshold voltage (Vth) may be controlled easily and the display performance may be guaranteed. In particular with respect to the active matrix organic light emitting diode (AMOLED) display devices, the importance of the Vth is more prominent. The stable and uniform threshold voltage (Vth) may lead to uniform display brightness and higher display quality. However, the thickness of the buffer layer corresponding to the bottom gate electrode of the conventional manufacturing method of the dual gate TFT array substrates is too thick, which may affect the performance of the whole array substrate caused by the bottom gate electrode, and may reduce the performance of the display panel.

SUMMARY

The present disclosure relates to a manufacturing method of thin film transistor (TFT) array substrate, including: providing a substrate; depositing a shading metal layer on the substrate, and applying a patterned process on the shading metal layer to form a bottom gate electrode; depositing a buffer layer on the bottom gate electrode and the substrate; applying the patterned process on the buffer layer to reduce a thickness of the buffer layer on a top of the bottom gate electrode; configuring a thickness of a thin area of the buffer layer such that the thin area of the buffer layer being configured to be as a bottom gate insulation layer between the bottom gate electrode and a semiconductor pattern; depositing a semiconductor layer on the buffer layer, and applying the patterned process on the semiconductor layer to form the semiconductor pattern corresponding to the bottom gate electrode within the thin area of the buffer layer; wherein a mask adopted in the patterned process of the buffer layer is the same as a mask adopted in the patterned process of the semiconductor layer or a mask adopted in the patterned process of the shading metal layer.

In another aspect, the present disclosure relates to a manufacturing method of TFT array substrate, including: providing a substrate; depositing a shading metal layer on the substrate; applying a patterned process on the shading metal layer to form a bottom gate electrode; depositing a buffer layer on the bottom gate electrode and the substrate; applying the patterned process on the buffer layer to reduce a thickness of the buffer layer on a top of the bottom gate electrode; depositing a semiconductor layer on the buffer layer, and applying the patterned process on the semiconductor layer to form a semiconductor pattern corresponding to the bottom gate electrode within the thin area of the buffer layer.

In another aspect, the present disclosure further relates to a TFT array substrate, including: a substrate; a bottom gate electrode configured in the substrate; a buffer layer covering the bottom gate electrode and the substrate, wherein a thin area is configured on the buffer layer, and the bottom gate electrode corresponds to the thin area; a semiconductor pattern configured within the thin area, and the semiconductor pattern corresponds to the bottom gate electrode.

In view of the above, the array substrate provided in the present disclosure is manufactured by applying the patterned process on the shading metal layer to form the bottom gate electrode, depositing the buffer layer on the bottom gate electrode and the substrate, applying the patterned process on the buffer layer to reduce the thickness of the buffer layer on the bottom gate electrode, depositing the semiconductor layer on the buffer layer, applying the patterned process on the semiconductor layer to form the semiconductor pattern corresponding to the bottom gate electrode within the thin area of the buffer layer. The present disclosure may configured the thin area as the bottom gate insulation layer of the bottom gate electrode by the thickness-reducing design, so as to improve the performance of the whole array substrate caused by the bottom gate electrode, and to maintain a certain thickness such that alkali metal ions and other impurities on the substrate may not pollute the semiconductor layer.

DETAILED DESCRIPTION OF THE EMBODIMENTS

The embodiments of the present disclosure will now be described more fully hereinafter with reference to the accompanying drawings, in which embodiments of the invention are shown. The figure and the embodiment described according to figure are only for illustration, and the present disclosure is not limited to these embodiments.

Figure 1:
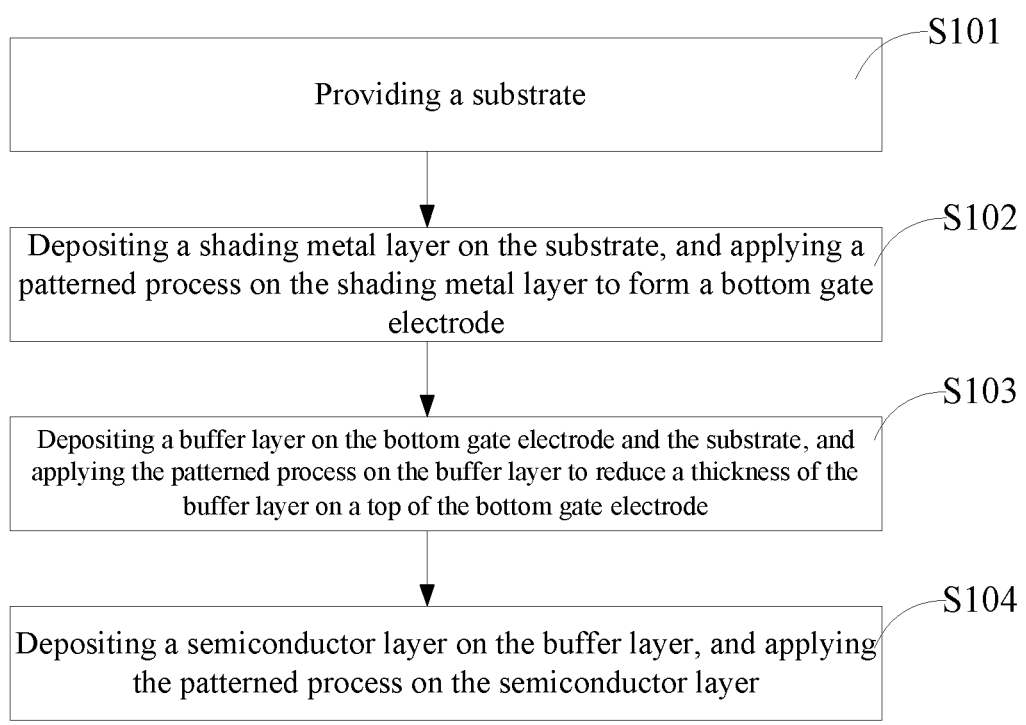
FIG. 1 is a flowchart of a manufacturing method of array substrates in one embodiment of the present disclosure.

As shown in FIG. 1, the present disclosure relates to a manufacturing method of thin film transistor (TFT) array substrates, wherein the manufacturing method includes the following steps.

In step S101: providing a substrate 100.

In one example, the substrate 100 is a transparent substrate. In another example, the substrate 100 may be a glass substrate, a plastic substrate, or other flexible substrates.

In step S102: depositing a shading metal layer 110 on the substrate 100, and applying a patterned process on the shading metal layer 110 to form a bottom gate electrode 101.

The shading metal layer 110 is sputtered on the substrate 100. The shading metal layer 110 is made of one or more of metal materials, such as molybdenum, aluminum, copper, and titanium, but the material is not limited in the present disclosure. The patterned process is applied on the shading metal layer 110 to form the bottom gate electrode 101.

In step S103: depositing a buffer layer 120 on the bottom gate electrode 101 and the substrate 100, and applying the patterned process on the buffer layer 120 to reduce a thickness of the buffer layer 120 on a top of the bottom gate electrode 101.

The buffer layer 120 is deposited on the substrate 100 having the bottom gate electrode 101. In one example, the buffer layer 120 is made of silicon oxide and/or silicon nitride. The patterned process is applied on the buffer layer 120, such that the thickness of the buffer layer 120 on the top of the bottom gate electrode 101 is reduced.

In step S104: depositing a semiconductor layer on the buffer layer 120, and applying the patterned process on the semiconductor layer.

The semiconductor layer (not shown) is deposited on the buffer layer 120. In one example, the semiconductor layer adopts metal oxide semiconductor due to the attributes, such as higher electron mobility and higher amorphous silicon process compatibility. As such, the manufacturing process may be simplified and the costs may be reduced.

The patterned process is applied on the semiconductor layer to form a semiconductor pattern 102 corresponding to the bottom gate electrode 101 within the thin area of the buffer layer 120.

A thickness-reducing process is applied on the buffer layer 120 corresponding to the top of the bottom gate electrode 101, so that a thickness of an area of the bottom gate electrode 101 corresponding to the buffer layer 120 is reduced. As such the performance of the array substrate 200 caused by the bottom gate electrode may be improved.

Figure 2:
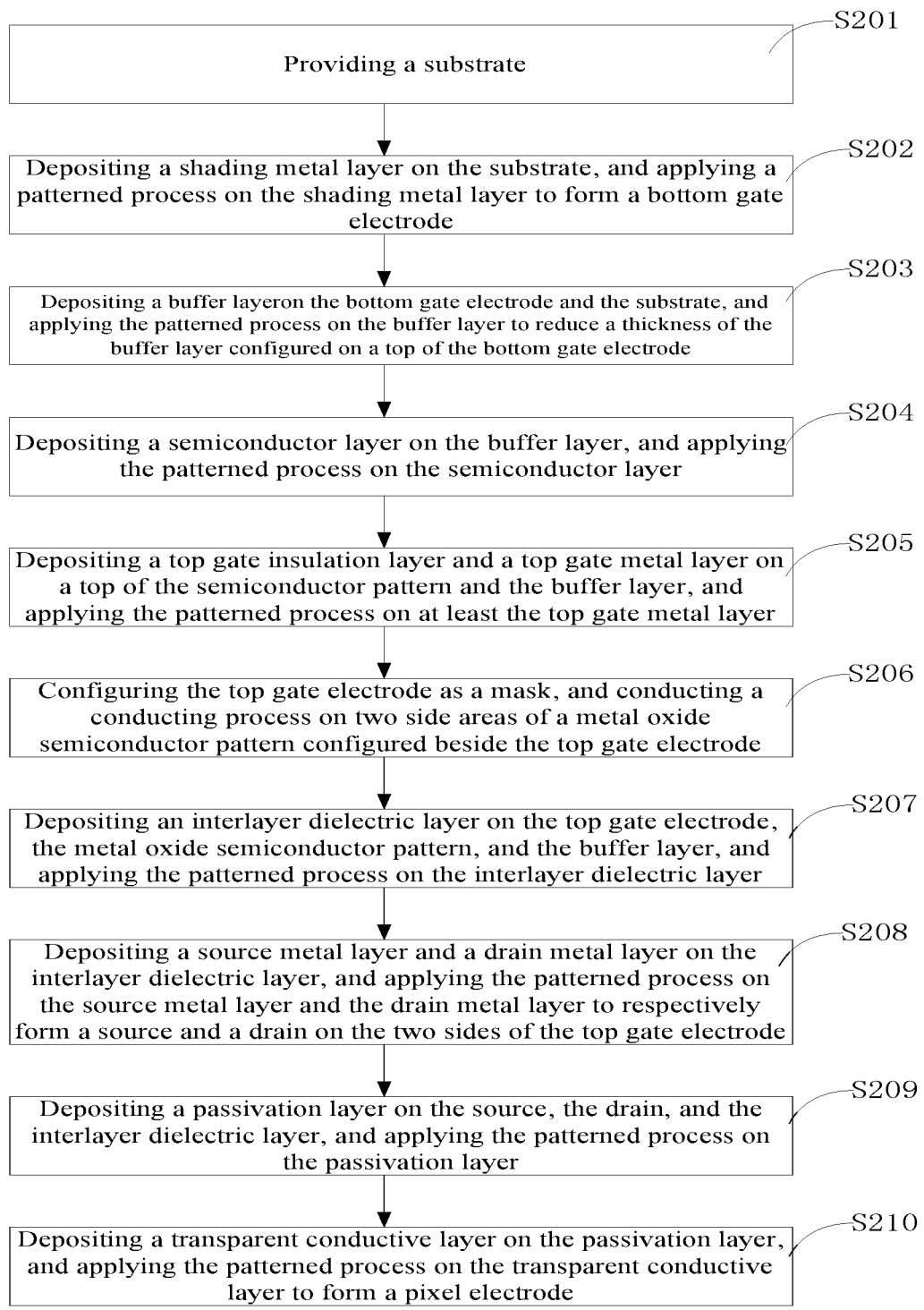
FIG. 2 is a flowchart of a manufacturing method of array substrates in another embodiment of the present disclosure.

Referring to FIG. 2, the manufacturing method of the array substrate 200 further includes the following steps.

In step S201: providing the substrate 100.

In step S202: depositing the shading metal layer 110 on the substrate 100, and applying the patterned process on the shading metal layer 110 to form the bottom gate electrode 101.

Wherein the steps S201 and S202 are similar to S101 and S102, and may not be described again. It is note that, the material of the substrate 100 and the shading metal layer 110 may be same with the material adopted in the previous embodiment, or may be different from the material adopted in the previous embodiment.

In step S203: depositing the buffer layer 120 on the bottom gate electrode 101 and the substrate 100, and applying the patterned process on the buffer layer 120 to reduce the thickness of the buffer layer 120 configured on the top of the bottom gate electrode 101.

The buffer layer 120 is deposited on the substrate 100 having the bottom gate electrode 101. In one example, the buffer layer 120 is made of one or the combination of silicon oxide and silicon nitride. In this embodiment, the buffer layer 120 provides a fine interface for the semiconductor layer. The thickness of the buffer layer 120 is configured such that alkali metal ions and other impurities on the substrate 100 may not pollute the semiconductor layer.

A mask related process is adopted to apply an exposure process, a development process, and an etching process with respect to the buffer layer 120 to reduce the thickness of the buffer layer 120 configured on the top of the bottom gate electrode. A thickness of the thin area of the buffer layer 120 is configured such that the thin area of the buffer layer 120 is configured to be as a bottom gate insulation layer 121 between the bottom gate electrode 101 and the semiconductor pattern 102. As such, the performance of the array substrate 200 caused by the bottom gate electrode 101 may be improved.

In step S204: depositing the semiconductor layer on the buffer layer 120, and applying the patterned process on the semiconductor layer.

The semiconductor layer is deposited on the buffer layer 120. In one example, the semiconductor layer is made of metal oxide semiconductor.

The mask related process is adopted to apply patterned process on the semiconductor layer to form the semiconductor pattern 102 corresponding to the bottom gate electrode 101 within the thin area of the buffer layer, such that the thin area of the buffer layer 120 is configured to be as the bottom gate insulation layer 121 between the bottom gate electrode 101 and the semiconductor pattern 102.2

A mask adopted in the mask related process to apply the patterned process in the steps S201 to S204 is the same as a mask adopted in the patterned process of the semiconductor layer or a mask adopted in the patterned process of the shading metal layer 110, so as to simplify the manufacturing process and to reduce the costs.

The mask adopted in the patterned process of the buffer layer 120 is the same as the mask adopted in the patterned process of the semiconductor layer. An etching area of the shading metal layer 110 and an etching area of the semiconductor layer are different from an etching area of the buffer layer 120. photoresist layers adopted in the patterned process of the semiconductor layer and a photoresist layer adopted in the patterned process of the shading metal layer 110 may be configured to be either one of a positive photoresist layer or a negative photoresist layer, and a photoresist layer adopted in the patterned process of the buffer layer 120 is configured to be the other one of the positive photoresist layer and the negative photoresist layer, so as to apply a development etching process on the etching area of the shading metal layer 110 and the semiconductor layer when there is no new mask added on.

Figure 3:
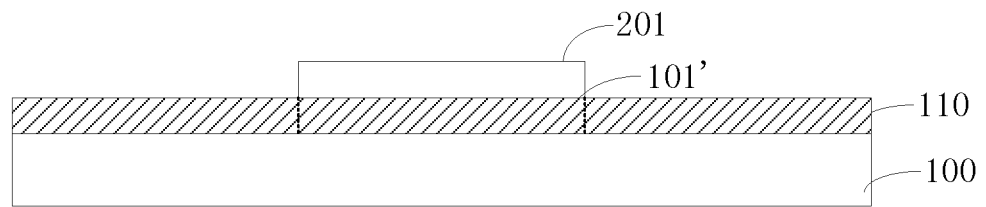
FIGS. 3 to 13 are schematic views of an array substrate manufactured by the manufacturing method in FIG. 2.
Figure 4:
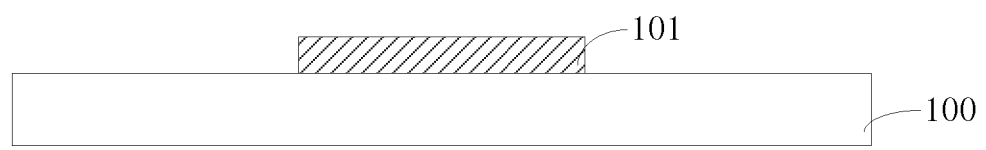

Specifically, in step S202, referring to FIG. 3 and FIG. 4, the shading metal layer 110 is deposited on the substrate 100, and the photoresist layer (not shown) is deposited on the deposited on the substrate 110. In one example, a thickness of the shading metal layer 110 is approximately 100 nm. The shading metal layer 110 is made of molybdenum, and is the positive photoresist layer.

As shown in FIG. 3, the mask (not shown) is adopted to apply an exposure development process on the positive photoresist layer. Wherein the mask includes a translucent portion corresponding to an area to be etched 101' of the bottom gate electrode, and the mask further includes a shading portion corresponding to an area outside of the area to be etched 101' of the bottom gate electrode. The mask is adopted to apply the exposure development process on the positive photoresist layer to obtain a positive photoresist pattern 201 covering the area to be etched 101' of the bottom gate electrode 101.

As shown in FIG. 4, the positive photoresist pattern 201 is adopted to apply the etching process on the shading metal layer 110, so as to pattern the shading metal layer 110. As such, one portion of the area to be etched 101' of the bottom gate electrode may be reserved to form the bottom gate electrode 101, and the other portion of the shading metal layer 110 without covering by the positive photoresist pattern 201 is etched. Afterward, the positive photoresist pattern 201 is removed to form the bottom gate electrode 101 on a top of the substrate 100.

Figure 5:
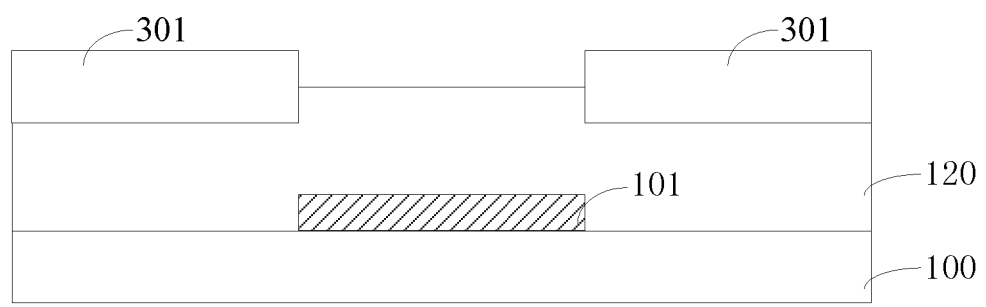
Figure 6:
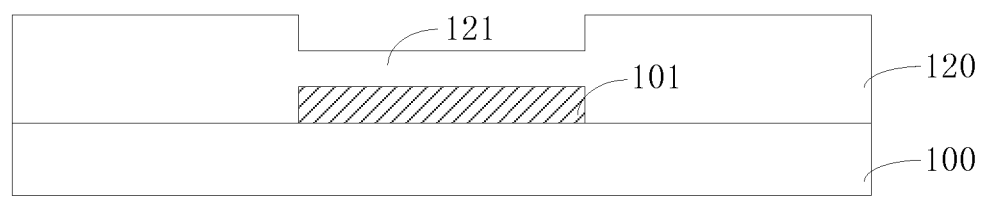

Referring to FIG. 5 and FIG. 6, in step S203, a chemical vapor deposition is adopted to deposit the buffer layer 120 on the substrate 100 having the bottom gate electrode 101. In one example, the buffer layer 120 is made of silicon oxide, and the thickness of the buffer layer 120 is approximately 300 nm. The thickness of the buffer layer 120 is configured such that alkali metal ions and other impurities on the substrate 100 may not pollute the semiconductor layer.

The photoresist layer (not shown) is deposited on the top of the buffer layer 120, and the photoresist layer is the negative photoresist layer.

As shown in FIG. 5, the mask is adopted to apply the exposure development process on the negative photoresist layer, so that the shading portion of the mask may correspond to an area of the buffer layer 120 where a thickness of the area is to be reduced. To simplify the manufacturing process and to conduct a self-aligning operation, the shading metal is adopted to form the bottom gate electrode 101. The buffer layer 120 is transparent due to material properties of the buffer layer 120. Therefore, the self-aligning operation may be adopted, so that the shading portion of the mask may correspond to the bottom gate electrode 101, and the translucent portion of the mask may correspond to an area outside of the bottom gate electrode 101. The mask is adopted to apply the exposure development process on the negative photoresist layer to obtain a negative photoresist pattern 301 covering the area outside of the bottom gate electrode 101.

As shown in FIG. 6, the negative photoresist pattern 301 is adopted to apply the etching process on the buffer layer 120, such that, a thickness of an area without covering by the negative photoresist pattern 301 is reduced, and a thickness of a portion of the buffer layer 120 covering by the negative photoresist pattern 301 may be reserved, i.e., the thickness of the buffer layer 120 configured on the top of the bottom gate electrode 101 is reduced. The thin area is configured to be as a bottom gate insulation layer 121 of the bottom gate electrode 101. The negative photoresist pattern is removed to form the buffer layer 120 covering the bottom gate electrode 101, and the thin area of the bottom gate electrode 101 corresponding to the buffer layer 120 is configured to be as the bottom gate insulation layer 121.

A thickness of the bottom gate insulation layer 121 is adjustable. Specifically, a dry etching process is adopted to apply the pattern process on the buffer layer 120. The thickness of the thin area of the buffer layer 120 to be reserved may be adjusted by controlling the power of the plasma and the etching rate. The thickness of the thin area of the buffer layer is configured such that the bottom gate insulation layer 121 is configured to be suitable for the bottom gate insulation layer 121 of a double-gate array substrate 200, so as to improve the performance of the whole array substrate 200 caused by the bottom gate electrode 101.

The same mask ma be adopted to pattern the bottom gate electrode 101 and to reduce the thickness of the buffer layer on the top of the bottom gate electrode 101, as long as to cover different the photoresist layers on the top of the bottom gate electrode 101 and the top of the buffer layer 120. It is not necessary to redesign the mask, and thus the costs may be reduced. The bottom gate electrode 101 is manufactured via the shading metal layer 110, as such, the self-align operation may be conducted easily during the manufacturing process, and the alignment accuracy and the efficiency may be improved. The thickness of the thin area of the buffer layer 120 may be adjusted by controlling the power of the plasma and the etching rate. Chances of excessive etching on the thin area of the buffer layer 120 and chances of the thickness of the thin area being too thick may be reduces, and the risk that the performance of the whole array substrate 200 caused by the bottom gate electrode 101 being out of control may also be reduced.

Figure 7:
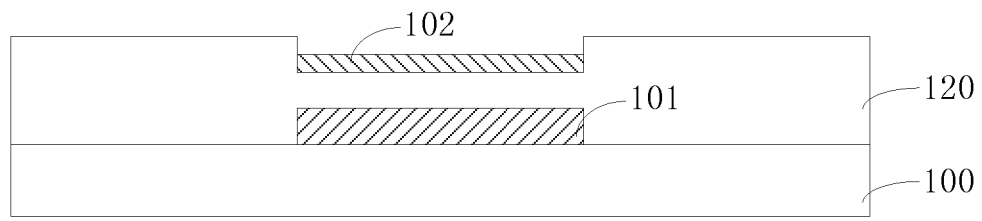

Referring to FIG. 7, in step S204, the semiconductor layer is deposited on the buffer layer 120, and the photoresist layer is deposited on the semiconductor layer. In one example, the semiconductor layer is made of indium gallium zinc oxide (IGZO). The thickness of the photoresist layer is approximately 60 nm, and the photoresist layer is the negative photoresist layer.

The mask is adopted to apply the patterned process on the semiconductor layer. The manufacturing process of the semiconductor layer is similar to the manufacturing process of the bottom gate electrode 101. The shading portion of the mask may correspond to the thin area, and the translucent portion of the mask may correspond to the area outside of the thin area. The mask is adopted to apply the exposure process, the development process, and the etching process on the semiconductor layer to form the semiconductor pattern 102 corresponding to the bottom gate electrode 101 within the thin area of the buffer layer 120.

In another embodiment of the present disclosure, the difference between this embodiment and the previous embodiment resides on that the negative photoresist layer covers on the shading metal layer 110, the positive photoresist layer covers on the buffer layer 120, and the negative photoresist layer covers on the semiconductor layer. The same mask is adopted to apply the exposure process, the development process, and the etching process on the negative photoresist layer configured on the shading metal layer 110, the positive photoresist layer on the buffer layer 120, and the negative photoresist layer on the semiconductor layer respectively, so as to obtain the same array substrate 200 described in the previous embodiment. The translucent portion of the mask corresponds to the area to be etched on the bottom gate electrode 101 with respect to the negative photoresist layer configured on the shading metal layer 110 and the negative photoresist layer on the semiconductor layer. The shading portion of the mask corresponds to the area outside of the area to be etched on the bottom gate electrode 101. The translucent portion of the mask corresponds to the area of the buffer layer 120 with respect to the positive photoresist on the buffer layer 120, wherein the thickness of the area is to be reduced. The manufacturing process of the development etching in this embodiment is similar with the previous embodiment, and may not be described again.

In step S205: depositing a top gate insulation layer (not shown) and a top gate metal layer (not shown) on a top of the semiconductor pattern 102 and the buffer layer 120, and applying the patterned process on at least the top gate metal layer.

Specifically, the chemical vapor deposition process is applied to deposit the top gate insulation layer on the semiconductor pattern 102 and the buffer layer 120, and sputter the top gate metal layer on the top gate insulation layer. In one example, the top gate insulation layer is made of one or the combination of silicon oxide and silicon chloride, and a thickness of the top gate insulation layer is approximately 150 nm. The top gate metal layer may be made of one or more of metal materials, such as copper, molybdenum, titanium, and aluminum, and the material of the top gate metal layer may be same with or different from the bottom gate electrode 101.

Figure 8:
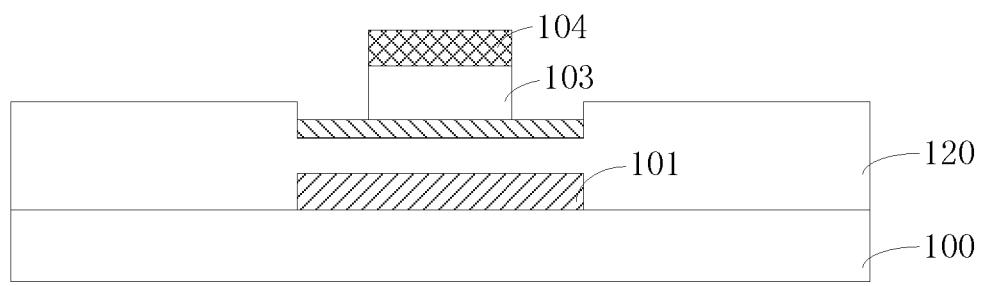

The mask related process is adopted to apply the patterned process on at least the top gate metal layer, so as to form a top gate electrode 104 corresponding to the semiconductor pattern 102. In one example, in order to avoid the influence on the performance of the whole array substrate 200 caused by the bottom gate electrode 101 and the semiconductor pattern 102, the mask is adopted to apply the patterned process on the top gate insulation layer and the top gate metal layer simultaneously to form a top gate insulation layer pattern 103 and the top gate electrode 104. The top gate insulation layer pattern 103 and the top gate electrode 104 cover a portion of the semiconductor pattern 102. As shown in FIG. 8, the top gate insulation layer pattern 103 and the top gate electrode 104 cover a middle area of the semiconductor pattern 102.

In step S206: configuring the top gate electrode as the mask, and conducting a conducting process on two side areas of the metal oxide semiconductor pattern 102 configured on the top gate electrode 104.

Figure 9:
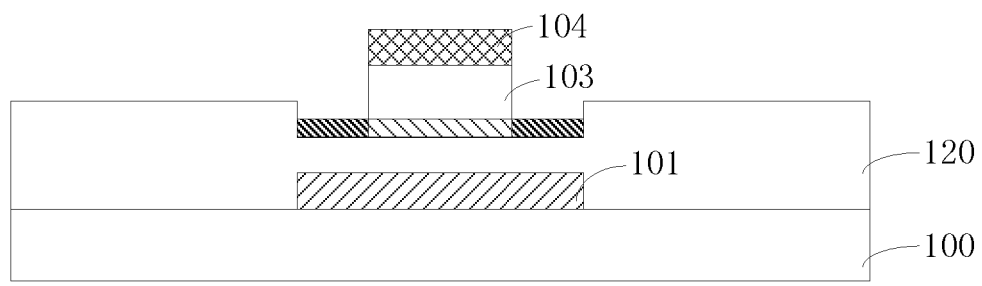

Specifically, the semiconductor pattern 102 may be the metal oxide semiconductor pattern 102. In one example, the top gate electrode 104 which has been applied to the patterned process may be configured to be as the mask and may be configured to apply the conducting process on two side areas of the metal oxide semiconductor pattern 102 configured on the top gate electrode 104, so as to reduce to the costs. As shown in FIG. 9, the top gate electrode 104 is configured to be as the mask, and the self-align operation may be conducted to apply a laser conducting process on the two side areas of the metal oxide semiconductor pattern 102. The mask is not necessary to be further designed to apply the conducting process on the semiconductor pattern 102, and thus the costs may be reduced.

In step S207: depositing an interlayer dielectric layer 130 on the top gate electrode 104, the metal oxide semiconductor pattern 102, and the buffer layer 120, and applying the patterned process on the interlayer dielectric layer 130.

The vapor deposition process is adopted to deposit the interlayer dielectric layer 130 on the top gate electrode 104, the metal oxide semiconductor pattern 102, and the buffer layer 120. In one example, the interlayer dielectric layer 130 may be made of one or the combination of silicon oxide and silicon nitride, and the thickness of the interlayer dielectric layer 130 is approximately 400 nm.

Figure 10:
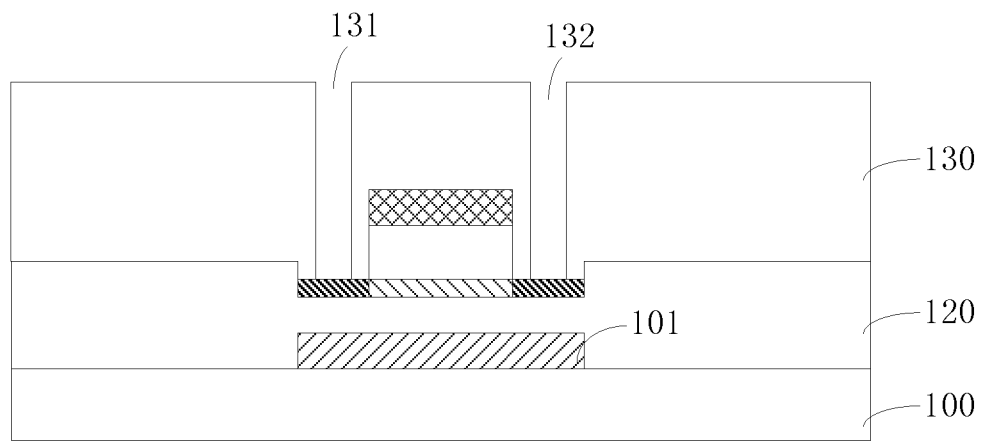

As shown in FIG. 10, the mask related process is adopted to apply the patterned process on the interlayer dielectric layer 130 to form a first through hole 131 and a second through hole 132 corresponding to the two side areas of the metal oxide semiconductor pattern 102.

In step S208: depositing a source metal layer (not shown) and a drain metal layer (not shown) on the interlayer dielectric layer 130, and applying the patterned process on the source metal layer and the drain metal layer to respectively form a source 142 and a drain 141 on the two sides of the top gate electrode 104.

Figure 11:
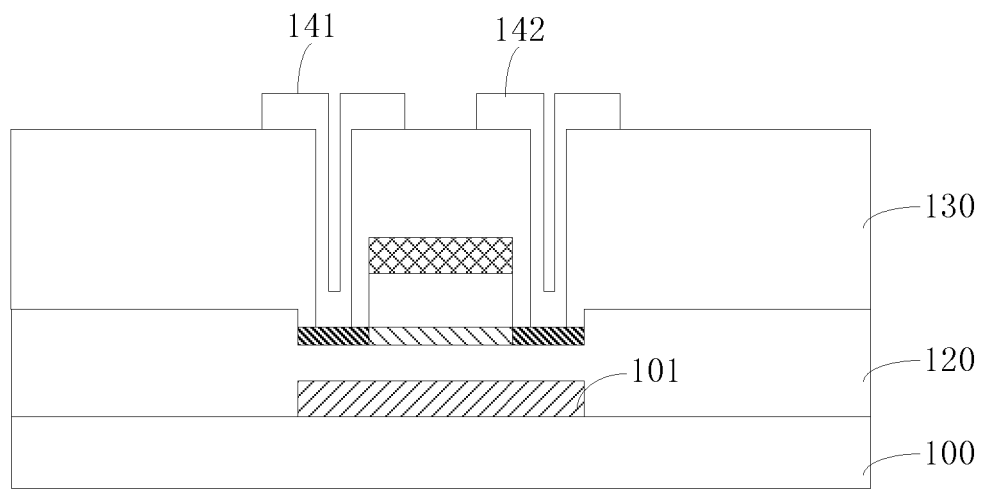

The source metal layer and the drain metal layer are deposited on the interlayer dielectric layer 130, and the patterned process is applied on the source metal layer and the drain metal layer to form the source 142 and the drain 141 configured on the two sides of the top gate electrode 104 respectively. As shown in FIG. 11, the source 142 and the drain 141 electrically connect with the two side areas of the metal oxide semiconductor pattern 102 via the first through hole 131 and the second through hole 132 respectively, i.e., the source 141 and the drain 142 electrically connect with the two side areas of the metal oxide semiconductor pattern 102.

In step S209: depositing a passivation layer 150 on the source 142, the drain 141, and the interlayer dielectric layer 130, and applying the patterned process on the passivation layer 150.

The passivation layer 150 is deposited on the source 142, the drain 141, and the interlayer dielectric layer 130. The passivation layer 150 is made of one or the combination of silicon oxide and silicon nitride, and a thickness of the passivation layer 150 is approximately 200 nm.

Figure 12:
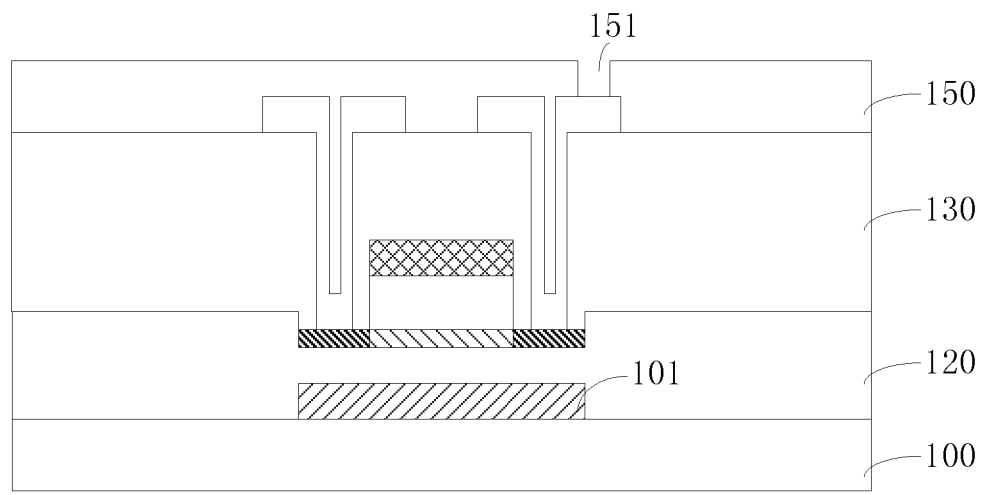

As shown in FIG. 12, the mask related process is adopted to apply the patterned process on the passivation layer 150 to form a third through hole 151 corresponding to the source 142 and the drain 141.

In step S210: depositing a transparent conductive layer (not shown) on the passivation layer 150, and applying the patterned process on the transparent conductive layer to form a pixel electrode 105.

Figure 13:
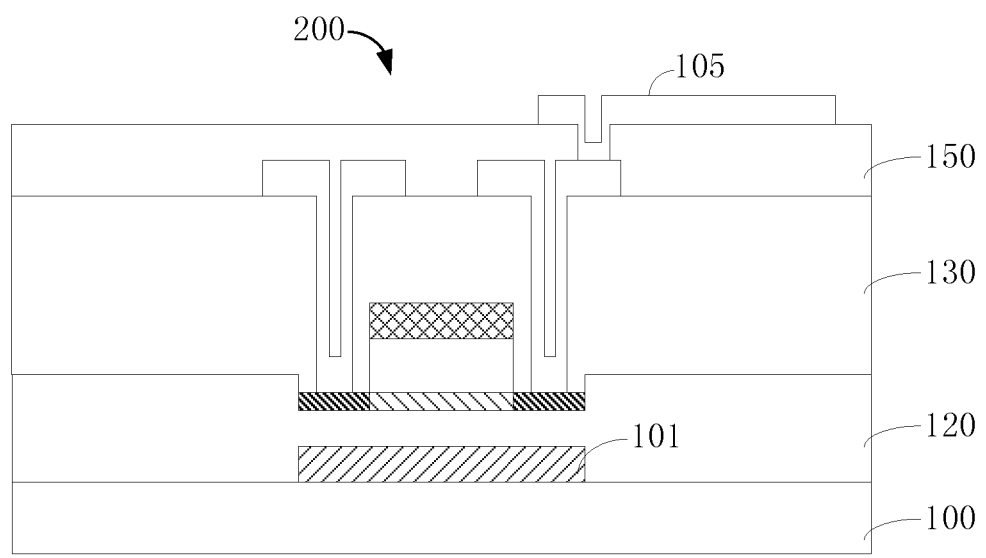

The transparent conductive layer is sputtered on the passivation layer 150, and the transparent conductive layer is made of the indium tin oxide (ITO). The mask related process is adopted to apply the patterned process on the transparent conductive layer to form the pixel electrode 105. The pixel electrode 105 electrically connect with the source 142 or the drain 141 via the third through hole 151. As shown in FIG. 13, the pixel electrode 105 electrically connect with the source 142 or the drain 141 via the third through hole 151.

At this point, the manufacturing process of the array substrate 200 in the disclosure is complete. It is note that the thickness of the layers within the array substrate 200 described in the embodiments are merely examples to make the person skilled in the art to understand, the present disclosure is not limited. The thickness of the layers within the array substrate 200 may be other value in other examples.

In another aspect, the array substrate 200 may be a back plate of active matrix organic light emitting diodes (AMO-LEDs), and a flat layer (not shown) is further deposited on the passivation layer 150. The mask related process is adopted to apply the patterned process on the passivation layer 150 to form a fourth through hole interconnecting with the third through hole 151. The pixel electrode 105 is configured on the flat layer, and the pixel electrode 105 electrically connect with the source 142 or the drain 141 via the fourth through hole and the third through hole 151.

The dual-gate AMOLED array substrate 200100 is manufactured by applying the patterned process on the bottom gate electrode 101, the buffer layer 120, and the semiconductor layer via the same mask. The conducting process is applied on the two side areas of the semiconductor pattern 102 by configuring the top gate electrode as the mask. The mask is not necessary to redesign in this manufacturing process, the number of the masks may be reduced, and thus the efficiency may be improved and the costs may be reduced. The buffer layer 120 in this embodiment may also be configured to be as the bottom gate insulation layer 121, and may be configured to be used as a buffer. The thickness of the thin area of the buffer layer 120 may be adjusted by reducing the thickness of the buffer layer corresponding to the bottom gate electrode 101. As such the thickness is configured such that the thin area is suitable for bottom gate insulation layer 121 so as to improve the performance of whole array substrate 200 caused by the bottom gate electrode 101. The area of the buffer layer 120 without reducing the thickness is configured such that alkali metal ions and other impurities on the substrate 100 may not pollute the semiconductor layer, so as to improve the performance of the active array substrate 200.

The present disclosure further relates to a TFT array substrate 200 manufactured by the manufacturing method described in above. As shown in FIG. 13, the array substrate 200 includes the substrate 100, the bottom gate electrode 101 configured on the substrate 100, the buffer layer 120 covering the bottom gate electrode 101 and the substrate 100, and the semiconductor pattern 102. Wherein the thin area is configured on the buffer layer 120, the bottom gate electrode 101 corresponds to the thin area, and the semiconductor pattern 102 corresponds to the bottom gate electrode 101.

The thickness of the thin area of the buffer layer 120 is configured such that the thin area of the buffer layer 120 is configured to be as the bottom gate insulation layer 121 between the bottom gate electrode 101 and the semiconductor pattern 102. Therefore, the buffer layer 120 of the array substrate 200100 may be configured to be as the bottom gate insulation layer 121, and may be configured to be used as the buffer. The thin area may be configured to be as the bottom gate insulation layer 121. As such, the performance of the whole array substrate 200 caused by the bottom gate electrode 101 may be improved, and the thickness of the buffer layer 120 is configured such that alkali metal ions and other impurities on the substrate 100 may not pollute the semiconductor pattern 102.

In the view of the above, the array substrate provided in the present disclosure is manufactured by applying the patterned process on the shading metal layer to form the bottom gate electrode, depositing the buffer layer on the bottom gate electrode and the substrate, applying the patterned process on the buffer layer to reduce the thickness of the buffer layer on the bottom gate electrode, depositing the semiconductor layer on the buffer layer, applying the patterned process on the semiconductor layer to form the semiconductor pattern corresponding to the bottom gate electrode within the thin area of the buffer layer. The present disclosure may configured the thin area as the bottom gate insulation layer of the bottom gate electrode by the thickness-reducing design, so as to improve the performance of the whole array substrate caused by the bottom gate electrode, and to maintain a certain thickness such that alkali metal ions and other impurities on the substrate may not pollute the semiconductor layer.

The above description is only the embodiments in the present disclosure, the claim is not limited to the description thereby. The equivalent structure or changing of the process of the content of the description and the figures, or to implement to other technical field directly or indirectly should be included in the claim.

What is claimed is:

1. A manufacturing method of thin film transistors (TFTS), comprising:
   providing a substrate;
   depositing a shading metal layer on the substrate, and applying a patterned process on the shading metal layer to form a bottom gate electrode;
   depositing a buffer layer on the bottom gate electrode and the substrate;
   applying the patterned process on the buffer layer to reduce a thickness of a thin area of the buffer layer disposed only directly above the bottom gate electrode, the thin area of the buffer layer being configured to be as a bottom gate insulation layer between the bottom gate electrode and a semiconductor pattern;
   depositing a semiconductor layer on the buffer layer, and applying the patterned process on the semiconductor layer to form the semiconductor pattern corresponding to the bottom gate electrode within the thin area of the buffer layer;
   wherein a mask adopted in the patterned process of the buffer layer is the same as a mask adopted in the patterned process of the semiconductor layer or a mask adopted in the patterned process of the shading metal layer.

2. The manufacturing method of the TFTS according to claim 1, wherein photoresist layers adopted in the patterned process of the semiconductor layer and a photoresist layer adopted in the patterned process of the shading metal layer are either a positive photoresist layer or a negative photoresist layer; a photoresist layer adopted in the patterned process of the buffer layer is the other one of the positive photoresist layer and the negative photoresist layer.

3. The manufacturing method of the TFTS according to claim 1, wherein the manufacturing method further comprises:
   depositing a top gate insulation layer and a top gate metal layer on a top of the semiconductor pattern and the buffer layer;
   applying the patterned process on at least the top gate metal layer to form a top gate electrode corresponding to the semiconductor pattern.

4. The manufacturing method of the TFTS according to claim 3, wherein the semiconductor pattern is a metal oxide semiconductor pattern, and the manufacturing method further comprises:
   configuring the top gate electrode as the mask; and
   conducting a conducting process on two side areas of the metal oxide semiconductor pattern configured on the top gate electrode.

5. The manufacturing method of the TFTS according to claim 4, wherein the manufacturing method further comprises:
   depositing an interlayer dielectric layer on the top gate electrode, the metal oxide semiconductor pattern, and the buffer layer, and applying the patterned process on the interlayer dielectric layer to form a first through hole and a second through hole corresponding to the two side areas of the metal oxide semiconductor pattern;
   depositing a source metal layer and a drain metal layer on the interlayer dielectric layer, and applying the patterned process on the source metal layer and the drain metal layer to respectively form a source and a drain on the two sides of the top gate electrode, wherein the source and the drain electrically connect with the two side areas of the metal oxide semiconductor pattern via the first through hole and the second through hole respectively.

6. The manufacturing method of the TFTS according to claim 5, wherein the manufacturing method further comprises:
   depositing a passivation layer on the source, the drain, and the interlayer dielectric layer;
   applying the patterned process on the passivation layer to form a third through hole corresponding to the source and the drain;
   depositing a transparent conductive layer on the passivation layer, and applying the patterned process on the transparent conductive layer to form a pixel electrode;
   wherein the pixel electrode electrically connects with the source and the drain via the third through hole.

7. A manufacturing method of TFTS, comprising:
   providing a substrate;
   depositing a shading metal layer on the substrate;
   applying a patterned process on the shading metal layer to form a bottom gate electrode;
   depositing a buffer layer on the bottom gate electrode and the substrate;

applying the patterned process on the buffer layer to reduce a thickness of a thin area of the buffer layer disposed only directly above the bottom gate electrode;

depositing a semiconductor layer on the buffer layer, and applying the patterned process on the semiconductor layer to form a semiconductor pattern corresponding to the bottom gate electrode within the thin area of the buffer layer.

8. The manufacturing method of the TFTS according to claim 7, wherein a thickness of a thin area of the buffer layer is configured such that the thin area of the buffer layer being configured to be as a bottom gate insulation layer between the bottom gate electrode and the semiconductor pattern.

9. The manufacturing method of the TFTS according to claim 7, wherein a mask adopted in the patterned process of the buffer layer is the same as a mask adopted in the patterned process of the semiconductor layer or a mask adopted in the patterned process of the shading metal layer.

10. The manufacturing method of the TFTS according to claim 9, wherein photoresist layers adopted in the patterned process of the semiconductor layer and a photoresist layer adopted in the patterned process of the shading metal layer are either a positive photoresist layer or a negative photoresist layer; a photoresist layer adopted in the patterned process of the buffer layer is the other one of the positive photoresist layer and the negative photoresist layer.

11. The manufacturing method of the TFTS according to claim 7, wherein the manufacturing method further comprises:

depositing a top gate insulation layer and a top gate metal layer on a top of the semiconductor pattern and the buffer layer;

applying the patterned process on at least the top gate metal layer to form a top gate electrode corresponding to the semiconductor pattern.

12. The manufacturing method of the TFTS according to claim 11, wherein the semiconductor pattern is a metal oxide semiconductor pattern, and the manufacturing method further comprises:

configuring the top gate electrode as the mask; and conducting a conducting process on two side areas of the metal oxide semiconductor pattern configured on the top gate electrode.

13. The manufacturing method of the TFTS according to claim 12, wherein the manufacturing method further comprises:

depositing an interlayer dielectric layer on the top gate electrode, the metal oxide semiconductor pattern, and the buffer layer, and applying the patterned process on the interlayer dielectric layer to form a first through hole and a second through hole corresponding to the two side areas of the metal oxide semiconductor pattern;

depositing a source metal layer and a drain metal layer on the interlayer dielectric layer, and applying the patterned process on the source metal layer and the drain metal layer to respectively form a source and a drain on the two sides of the top gate electrode, wherein the source and the drain electrically connect with the two side areas of the metal oxide semiconductor pattern via the first through hole and the second through hole respectively.

14. The manufacturing method of the TFTS according to claim 13, wherein the manufacturing method further comprises:

depositing a passivation layer on the source, the drain, and the interlayer dielectric layer;

applying the patterned process on the passivation layer to form a third through hole corresponding to the source and the drain;

depositing a transparent conductive layer on the passivation layer; and applying the patterned process on the transparent conductive layer to form a pixel electrode;

wherein the pixel electrode electrically connects with the source and the drain via the third through hole.

15. A TFT array substrate, comprising:

a substrate;

a bottom gate electrode configured on the substrate;

a buffer layer covering the bottom gate electrode and the substrate, wherein the buffer layer has a thin area which is disposed only directly above the bottom gate electrode;

a semiconductor pattern configured within the thin area, and the semiconductor pattern corresponds to the bottom gate electrode.

16. The TFT array substrate according to claim 15, wherein a thickness of the thin area of the buffer layer is configured such that the thin area of the buffer layer being configured to be as a bottom gate insulation layer between the bottom gate electrode and the semiconductor pattern.

17. The TFT array substrate according to claim 15, wherein the array substrate further comprises:

a top gate insulation layer configured on the semiconductor pattern;

a top gate electrode configured on the top gate insulation layer, wherein the top gate electrode corresponds to the semiconductor pattern.

18. The TFT array substrate according to claim 17, wherein the array substrate further comprises:

an interlayer dielectric layer covering on a top of the top gate electrode;

a first through hole and a second through hole configured on two side areas of the semiconductor pattern, wherein the two side areas correspond to the interlayer dielectric layer;

a source and a drain configured on the interlayer dielectric layer, wherein the source and the drain electrically connect with the two side areas of the semiconductor pattern via the first through hole and the second through hole.

19. The TFT array substrate according to claim 18, wherein the array substrate further comprises:

a passivation layer configured on the interlayer dielectric layer, wherein the passivation layer covers the source and the drain;

a third through hole configured on the passivation layer, and the third through hole corresponds to a top of the source and the drain;

a pixel electrode electrically connecting with the source and the drain via the third through hole.

* * * * *